(12) United States Patent
Bangsaruntip et al.

(10) Patent No.: US 8,008,146 B2
(45) Date of Patent: Aug. 30, 2011

(54) DIFFERENT THICKNESS OXIDE SILICON NANOWIRE FIELD EFFECT TRANSISTORS

(75) Inventors: Sarunya Bangsaruntip, Mount Kisco, NY (US); Andres Bryant, Burlington, VT (US); Guy Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 12/631,148

(22) Filed: Dec. 4, 2009

(65) Prior Publication Data

US 2011/0133280 A1 Jun. 9, 2011

(51) Int. Cl.
*H01L 21/8238* (2006.01)
*H01L 29/76* (2006.01)

(52) U.S. Cl. ........ 438/211; 438/149; 438/157; 438/200; 438/218; 438/257; 438/258; 438/790; 257/324; 257/329; 257/401; 257/500; 257/501; 257/E21.625; 257/E21.629; 257/E21.679; 257/E27.081; 257/E27.103

(58) Field of Classification Search .................. 438/149, 438/157, 200, 211, 218, 257, 258, 790; 257/324, 257/329, 401, 500, 501, E21.625, E21.629, 257/E21.679, E27.081, E27.103
See application file for complete search history.

(56) References Cited

U.S. PATENT DOCUMENTS

| | | | |
|---|---|---|---|
| 5,872,378 A | 2/1999 | Rose et al. | |
| 6,181,193 B1 | 1/2001 | Coughlin, Jr. | |
| 6,207,588 B1 | 3/2001 | Choi et al. | |
| 6,340,625 B1 | 1/2002 | Choi et al. | |
| 6,362,606 B1 | 3/2002 | Dupuis et al. | |
| 6,392,488 B1 | 5/2002 | Dupuis et al. | |
| 6,500,728 B1 | 12/2002 | Wang | |
| 6,504,418 B1 | 1/2003 | Coughlin, Jr. | |
| 6,551,881 B1 | 4/2003 | Letavic | |
| 6,724,048 B2 | 4/2004 | Min et al. | |
| 6,821,913 B2 | 11/2004 | Chuang et al. | |
| 6,951,792 B1 | 10/2005 | McElheny et al. | |
| 6,970,036 B2 | 11/2005 | Mizuno | |
| 7,129,554 B2 | 10/2006 | Lieber et al. | |
| 7,161,414 B2 | 1/2007 | Mizuno | |
| 7,211,464 B2 | 5/2007 | Lieber et al. | |
| 7,224,195 B2 | 5/2007 | Pilling et al. | |

(Continued)

OTHER PUBLICATIONS

IBM Patent Application filed on Feb. 4, 2009, in The USPTO, having U.S. Appl. No. 12/365,623.

*Primary Examiner* — Dao H Nguyen

(74) *Attorney, Agent, or Firm* — Gibb I.P. Law Firm, LLC; Richard M. Kotulak, Esq.

(57) ABSTRACT

A method (that produces a structure) patterns at least two wires of semiconductor material such that a first wire of the wires has a larger perimeter than a second wire of the wires. The method performs an oxidation process simultaneously on the wires to form a first gate oxide on the first wire and a second gate oxide on the second wire. The first gate oxide is thicker than the second gate oxide. The method also forms gate conductors over the first gate oxide and the second gate oxide, forms sidewall spacers on the gate conductors, and dopes portions of the first wire and the second wire not covered by the sidewall spacers and the gate conductors to form source and drain regions within the first wire and the second wire.

6 Claims, 8 Drawing Sheets

U.S. PATENT DOCUMENTS

| | | |
|---|---|---|
| 7,224,232 B2 | 5/2007 | Paul et al. |
| 7,254,151 B2 | 8/2007 | Lieber et al. |
| 7,256,466 B2 | 8/2007 | Lieber et al. |
| 7,888,751 B2 * | 2/2011 | Sawada .................. 257/401 |
| 2002/0164858 A1 * | 11/2002 | Sayama et al. ............ 438/289 |
| 2007/0281414 A1 * | 12/2007 | Ohkawa et al. ............ 438/218 |
| 2007/0296030 A1 * | 12/2007 | Shukuri et al. ............ 257/329 |
| 2008/0061284 A1 | 3/2008 | Chu et al. |
| 2008/0286919 A1 * | 11/2008 | Goda ...................... 438/211 |
| 2008/0293246 A1 | 11/2008 | Cohen et al. |

* cited by examiner

US 8,008,146 B2

DIFFERENT THICKNESS OXIDE SILICON NANOWIRE FIELD EFFECT TRANSISTORS

BACKGROUND

The present invention relates to field effect transistors, and more specifically, to nanowire field effect transistors that have different wire thicknesses and different gate oxide thicknesses.

In typical complementary metal oxide semiconductor (CMOS) technologies, there usually are at two sets of devices. One set of devices forms the core logic high-performance devices and usually has a 1.0V operation voltage, or lower. The other set is optimized for interfacing to off chip devices and typically is optimized for 1.5V, or higher. This optimization drives a process that typically involves growing a thick dielectric everywhere, using lithography and a mask and a wet etch to remove the thick dielectric from some regions, and then growing a thinner dielectric in those regions. The high voltage devices are populated on thick dielectric regions and low voltage devices are built on the thin dielectric region. This process gives two distinct gate dielectrics and the two device types are then optimized around this structure. The negatives of this approach are that it requires an extra lithography and etch sequence, and any defects in the mask protecting the thick dielectric will directly translate into a yield loss for these devices.

SUMMARY

One embodiment disclosed herein comprises a method for forming an integrated circuit device that patterns at least two wires of semiconductor material such that a first wire of the wires has a larger perimeter than a second wire of the wires. The method performs an oxidation process simultaneously on the wires to form a first gate oxide on the first wire and a second gate oxide on the second wire. The first gate oxide is thicker than the second gate oxide. The method also forms gate conductors over the first gate oxide and the second gate oxide, forms sidewall spacers on the gate conductors, and dopes portions of the first wire and the second wire not covered by the sidewall spacers and the gate conductors to form source and drain regions within the first wire and the second wire. Thus, the method forms two separate transistors using a single, unmasked oxidation process.

An alternative method disclosed herein simultaneously patterns at least two wires of semiconductor material in a manner that forms a first wire for a first transistor and a second wire for a second transistor, such that a first wire of the wires has a larger perimeter than a second wire of the wires. The method performs an oxidation process simultaneously on the first wire and the second wire to simultaneously form a first gate oxide around the first wire and a second gate oxide around the second wire. The first gate oxide is thicker than the second gate oxide. The method also simultaneously forms gate conductors over the first gate oxide and the second gate oxide, simultaneously forms sidewall spacers on the gate conductors, and simultaneously dopes portions of the first wire and the second wire not covered by the sidewall spacers and the gate conductors to form source and drain regions within the first wire and the second wire and to form the first transistor and the second transistor.

One apparatus embodiment herein comprises an integrated circuit structure having a substrate, at least two wires of semiconductor material, first and second gate oxides around the wires, gate conductors over the first gate oxide and the second gate oxide, and sidewall spacers on the gate conductors. The first wire has a greater width and height than the second wire. The first gate oxide is thicker than the second gate oxide. Portions of the wires not covered by the sidewall spacers and the gate conductors comprise source and drain regions and the wires each comprise a channel region.

Another apparatus embodiment comprises an integrated circuit structure having a substrate, a trench within the substrate, at least two adjacent, parallel wires of semiconductor material across the trench, a first gate oxide around the first wire, a second gate oxide around the second wire, gate conductors over the first gate oxide and the second gate oxide, and sidewall spacers on the gate conductors. The first wire has a greater width and height than the second wire. The first gate oxide is thicker than the second gate oxide. Portions of the first wire and the second wire not covered by the sidewall spacers and the gate conductors comprise source and drain regions. The first wire and the second wire each comprise a separate channel region. The first wire and corresponding ones of the gate conductors, the source and drain regions, and the channel region form a first transistor having first characteristics. The second wire and corresponding ones of the gate conductors, the source and drain regions, and the channel region form a second transistor immediately adjacent to the first transistor that has second characteristics that are different than the first characteristics.

DETAILED DESCRIPTION

Figure 1:
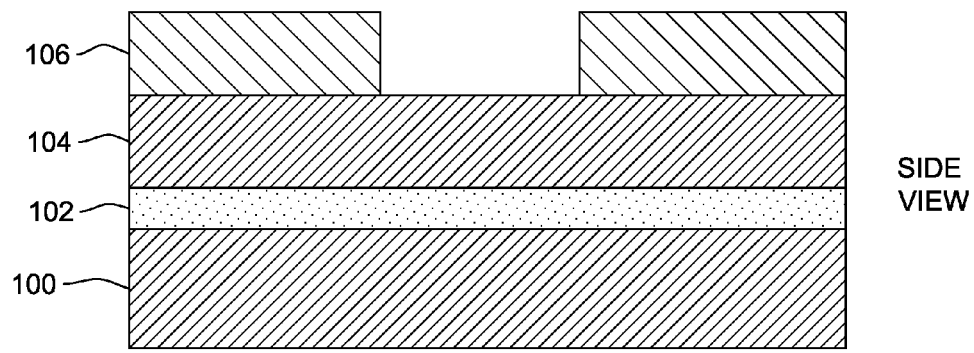
FIG. 1 is a cross-sectional side-view schematic diagram of an integrated circuit structure.
Figure 8A:
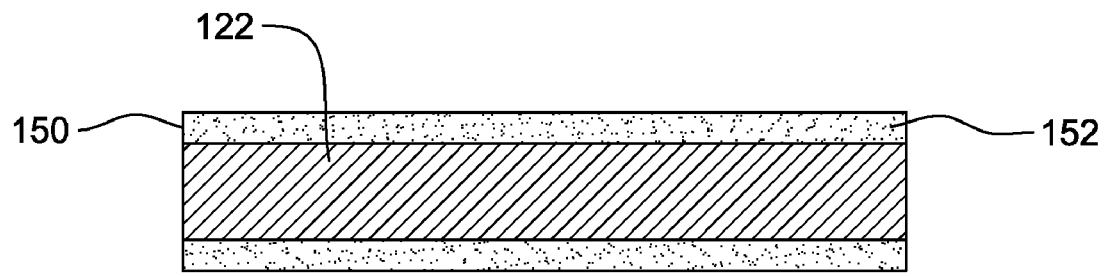
FIG. 8A is an expanded view of the wire in FIG. 7A.
Figure 8B:
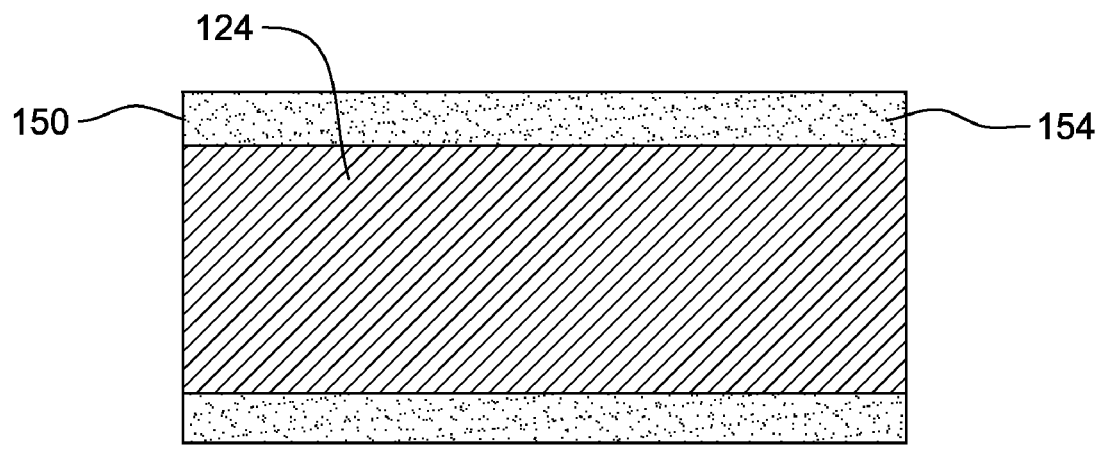
FIG. 8B is an expanded view of the wire in FIG. 7B.
Figure 9A:
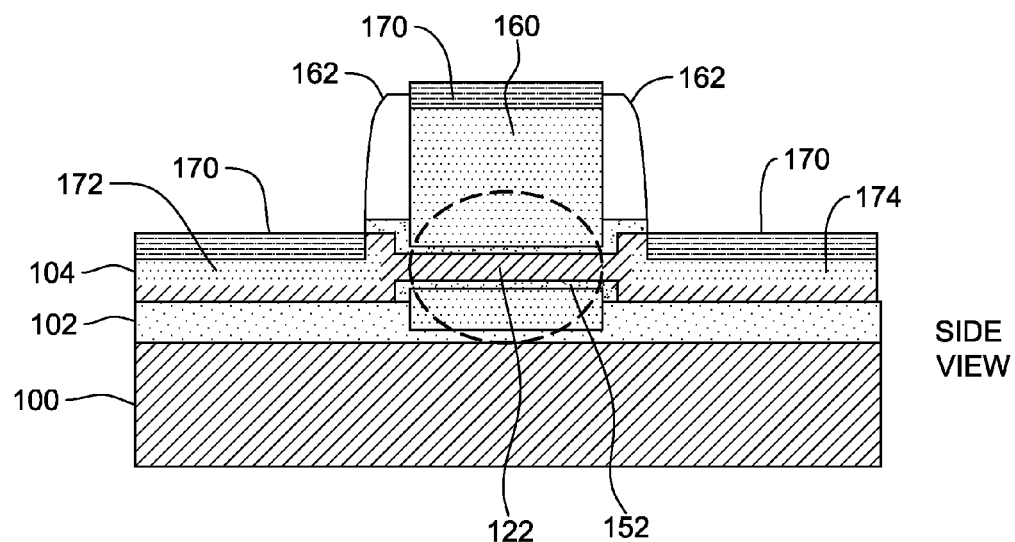
FIG. 9A is a cross-sectional side-view schematic diagram of the integrated circuit structure.
Figure 9B:
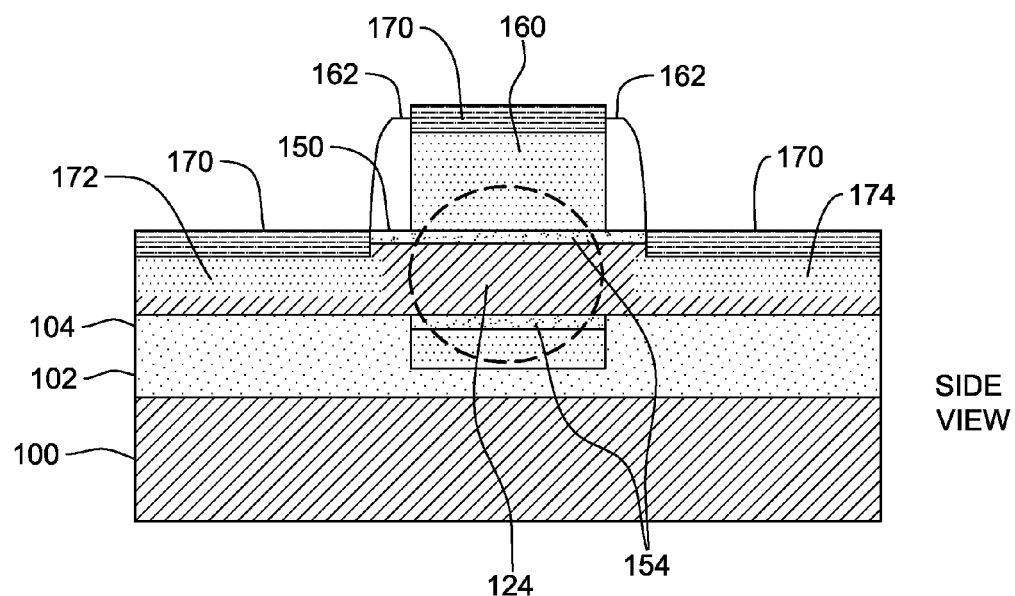
FIG. 9B is a cross-sectional side-view schematic diagram of the integrated circuit structure.
Figure 10:
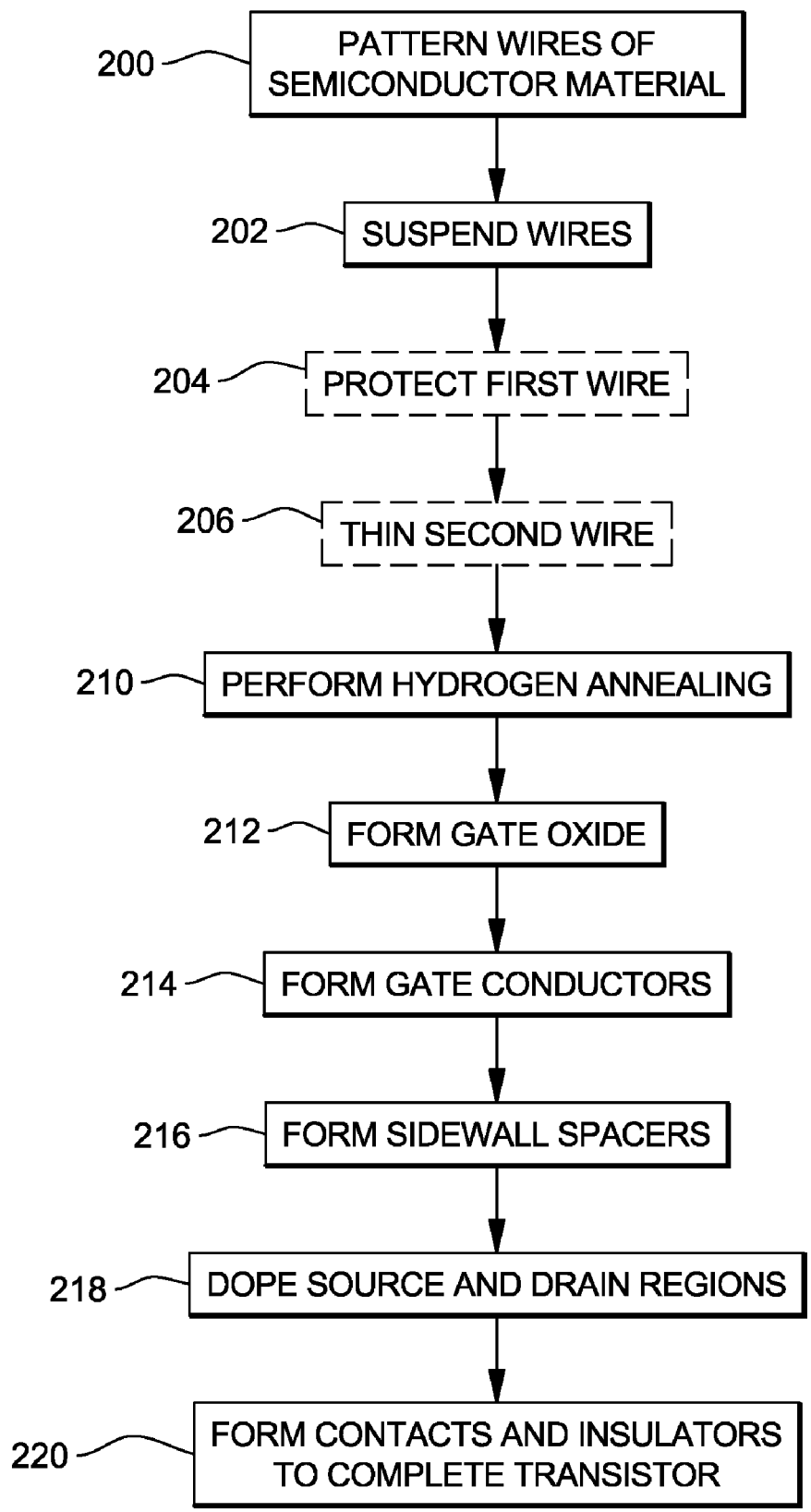
FIG. 10 is a flow diagram illustrating aspects of embodiments herein.

FIGS. 1-9B illustrate embodiments herein and FIG. 10 is a flowchart illustrating the processes performed herein. FIG. 1 illustrates a laminated integrated circuit structure in cross-sectional view. The structure includes a substrate made up of layers 100 and 104 that are separated by an insulator 102, such as a buried oxide layer (BOX).

The substrate 100, and layer 104 can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures etc. Preferably, substrate 100 comprises of silicon, and layer 104 also comprises of single-crystal silicon. Since layer 104 is separated from substrate 100 by an insulator it is referred to as silicon-on-insulator (SOI).

Layer 102 comprises a dielectric such as silicon dioxide and is sometimes referred to as the buried oxide layer (BOX). The wafer of FIG. 1 can be fabricated using methods such as Separation by IMplanted OXygen (SIMOX) or wafer bonding (for example, SmartCut™). These wafer fabrication techniques are known to those of skill in the art and thus are not described further herein.

Item 106 is a mask or protective layer and can comprise any form of commonly available masking material, such as an organic photoresist. As is well known to those ordinarily skilled in the art, such masks are generally exposed to a light source (which changes their reaction to a developer) and rinsed with a developer to form a protective pattern.

Figure 2A:
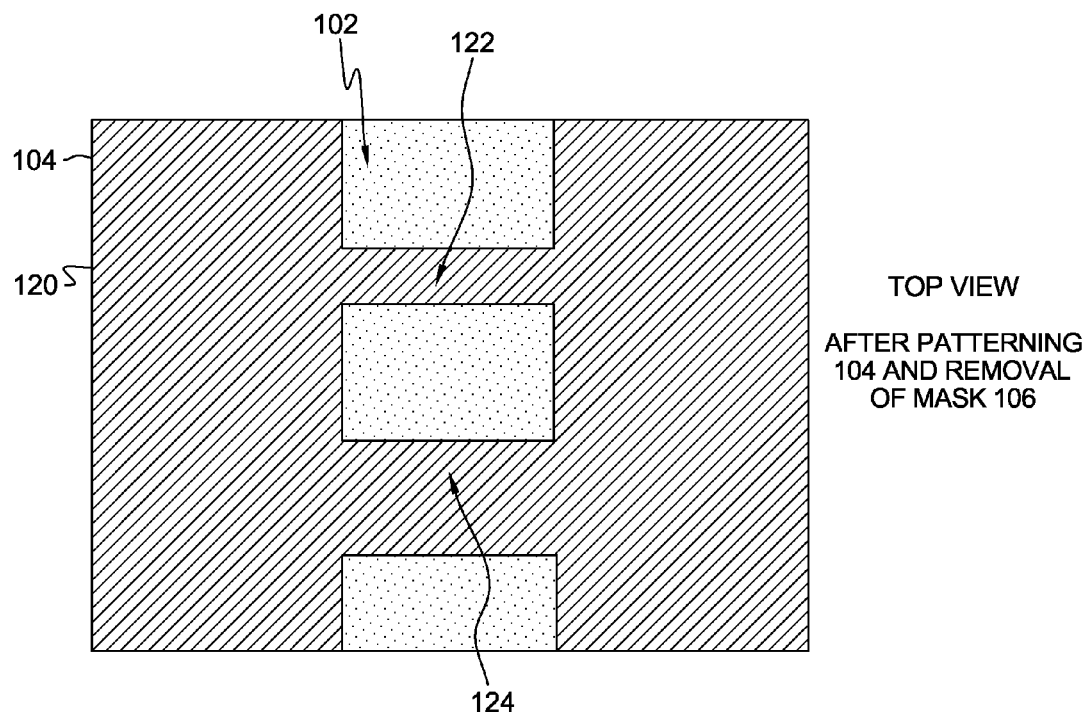
FIG. 2A is a top-view schematic diagram of an integrated circuit structure.

As shown in item 200 in FIG. 10 and in FIG. 2A, the embodiments herein pattern at least two wires 122, 124 by etching layer 104 using the mask 106. Typically etching of layer 104 is done by reactive ion etching (RIE). The etching is selective so it preferentially removes silicon but does not attack silicon dioxide. An example of a selective RIE chemistry is hydrogen bromide (HBr)-based chemistry.

Figure 2B:
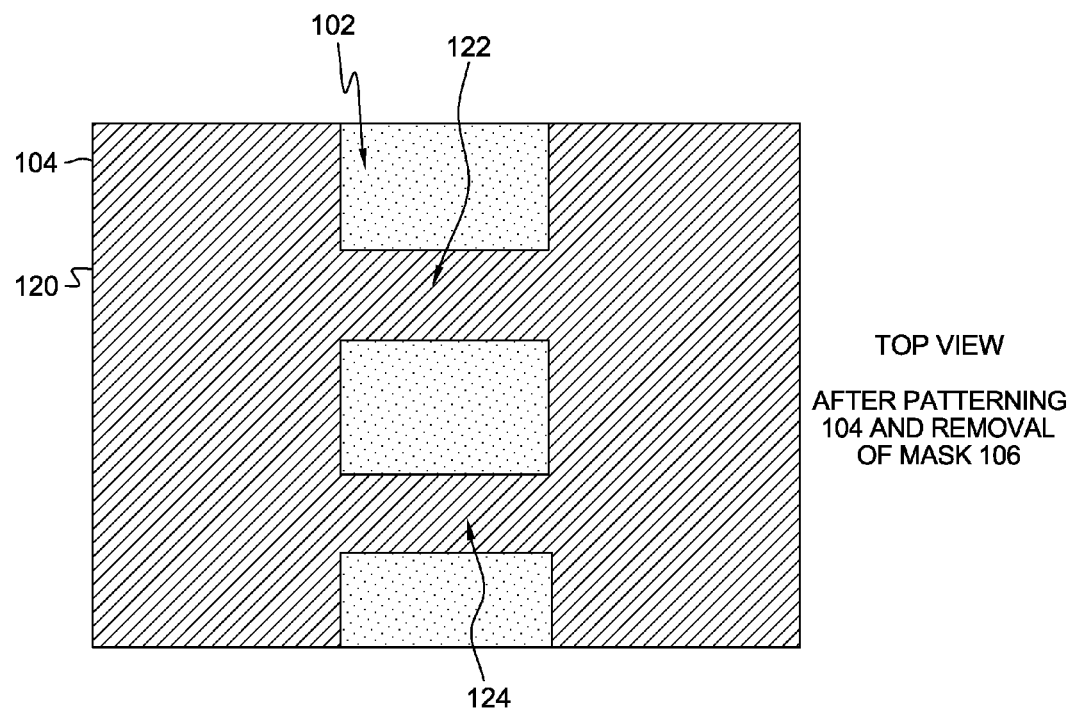
FIG. 2B is a cross-sectional side-view schematic diagram of the integrated circuit structure.

The patterning process in item 200 can form the wires 122, 124 to be different sizes as shown in FIG. 2A. Alternatively, the patterning process in item 200 can form the wires 122, 124 to be the same size, as shown in FIG. 2B. The wires 122, 124 will eventually form two separate transistors. A first wire 124 will form a first transistor and a second wire 122 will form a second transistor. Note that some of the numbering is not provided in all drawings for clarity. While drawing 2A and 2B show the two nanowires 122 and 124 (and later transistors) as electrically connected through a continuous solid pad 104, in many cases the first transistor and second transistor will need to be electrically isolated. This is typically done by using a mask 106 that define two separate regions 104. When the SOI film is thick or when bulk technology is used, other well known isolation processes such as trench isolation and well isolation can be practiced.

Figure 3:
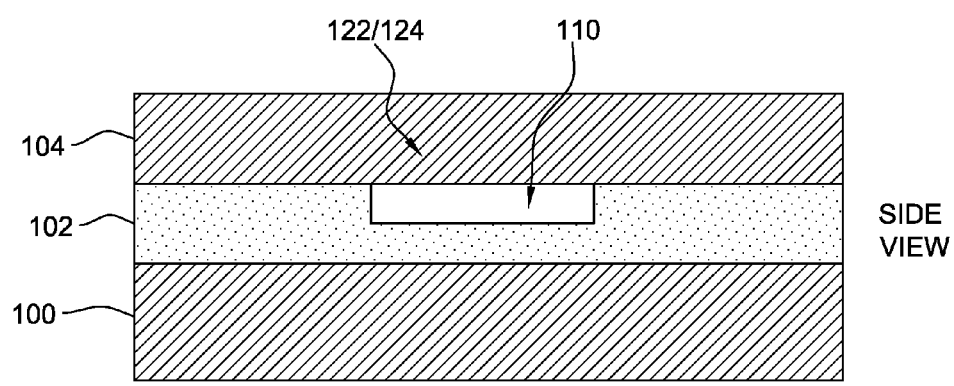
FIG. 3 is a cross-sectional side-view schematic diagram of an integrated circuit structure.

In item 202 in FIG. 10, the embodiments herein suspend the wires 122, 124 by removing the oxide material 102 from beneath the wires, thereby creating a void 110 as illustrated in FIG. 3. The oxide material 102 can be selectively removed from the silicon material 104 using, for example, hydrofluoric acid (HF) which result in an isotropic etching process, or any other selective material removal process whether currently known or developed in the future.

Figure 4:
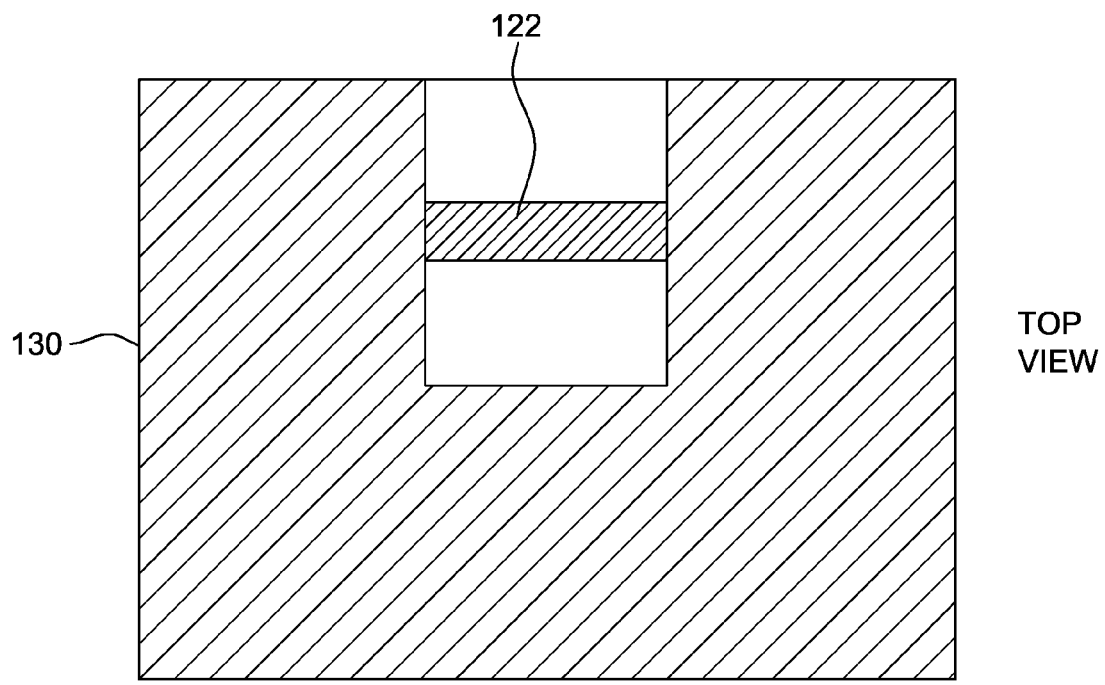
FIG. 4 is a top-view schematic diagram of an integrated circuit structure.

After this, the embodiments herein form a number of optional and/or alternative processes to reduce of the dimensions of the wires. For example, if the wires are formed to have uniform sizes (as illustrated in FIG. 2B) in item 204, the embodiments herein can optionally protect the first wire 124 with a protective material 130 (FIG. 4). The protective material 130 can also comprise any form of commonly available masking material that forms a good oxidation barrier, such as silicon nitride ($Si_3N_4$).

Figure 5A:
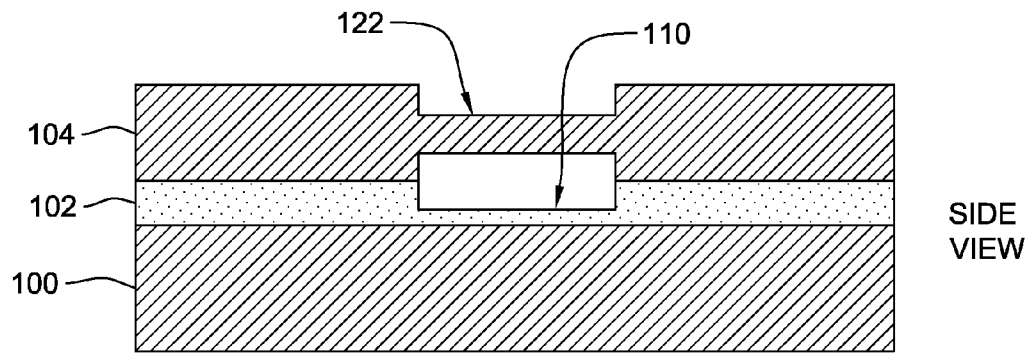
FIG. 5A is a cross-sectional side-view schematic diagram of the integrated circuit structure.
Figure 5B:
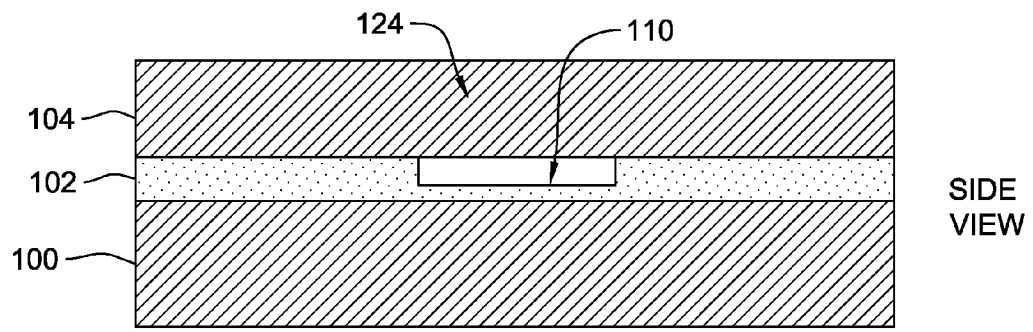
FIG. 5B is a cross-sectional side-view schematic diagram of the integrated circuit structure.
Figure 6:
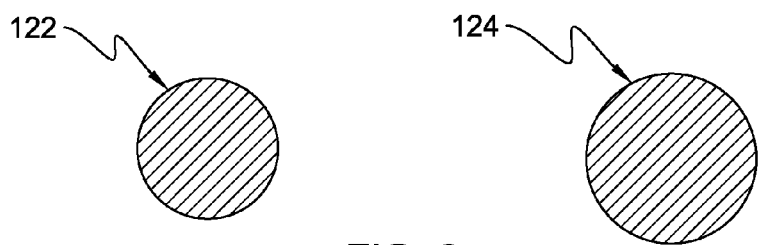
FIG. 6 illustrates cross-section sections of the wires 122 and 124 illustrated in FIGS. 5A and 5B.

In item 206 in FIG. 10, the method performs at least one cycle of wire thinning on the second wire 122. Each process of wire thinning can comprise an oxidation cycle (heating in an oxygen or water vapor ambient) and an oxide removal cycle, such as etching in diluted HF. This reduces the thickness of the wire 122 so that the first wire 124 has a greater width and height than the second wire 122 after the wire thinning cycles The resulting structures are shown in FIGS. 5A-5B, FIG. 5A is showing a cross-sectional view taken through the length of wire 122, and FIG. 5B is showing a cross-sectional view taken through the length of wire 124. The masked oxidation leads to wire 122 having smaller dimensions than wire 124. In item 210, the embodiments herein can perform a hydrogen annealing process on the wires 122, 124, which round the wires so their cross-section shape is approaching that of a cylinder and further reduces the dimensions (circumference) of the wires 122, 124. The rounding of the wires is illustrated in FIG. 6 which shows a cross-sectional view through the wires in a plane perpendicular to their longitudinal axis. The hydrogen pressure and the annealing temperature can be adjusted to control the speed of which silicon redistribute.

Figure 7A:
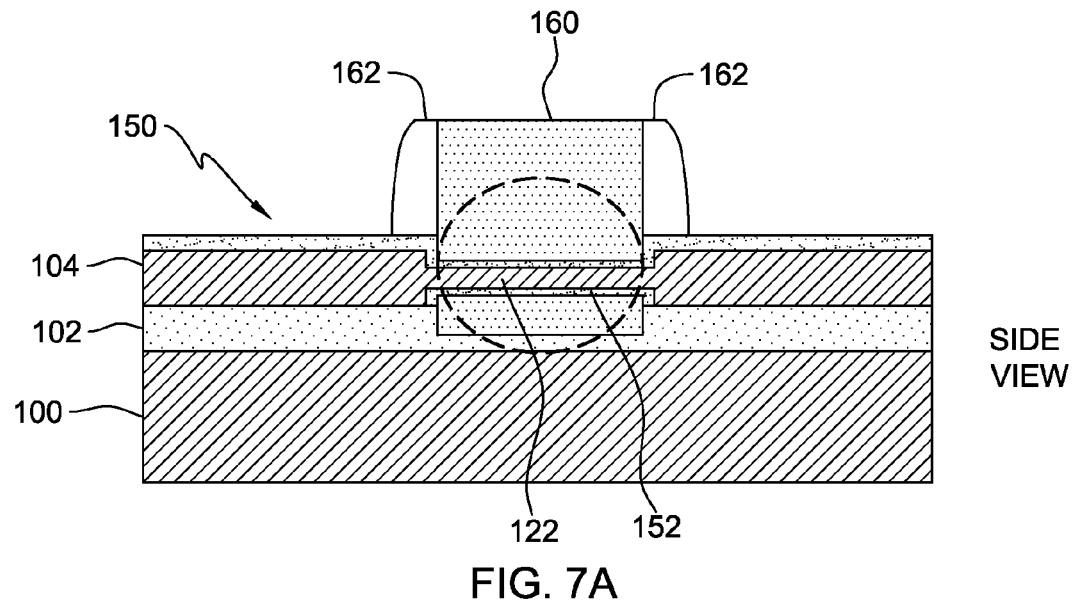
FIG. 7A is a cross-sectional side-view schematic diagram of the integrated circuit structure along line A-A'.
Figure 7B:
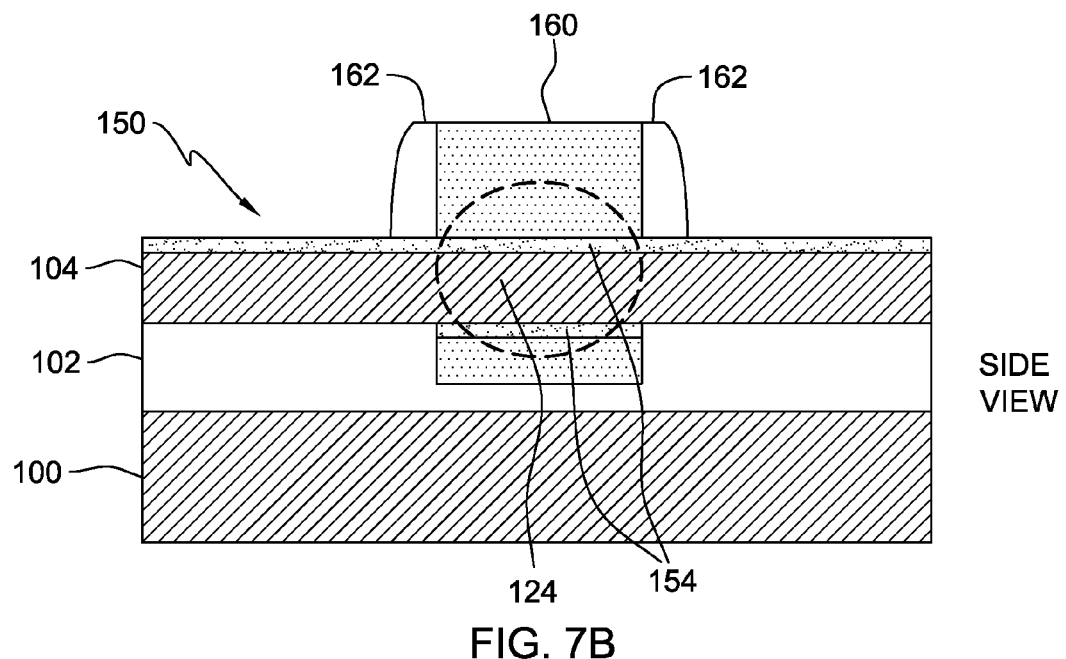
FIG. 7B is a cross-sectional side-view schematic diagram of the integrated circuit structure along line B-B'.

In item 212 in FIG. 10 and FIGS. 7A-7B, the embodiments herein perform a single oxidation process on the exposed wires 122, 124 to form a single continuous gate oxide 150 around the wires 122, 124. The gate oxide 150 comprises a first gate oxide 154 on the first wire 124 and a second gate oxide 152 on the second wire 122. The oxidation process simultaneously forms the first gate oxide 154 and the second gate oxide 152 and the oxidation process is performed without the use of masking layers that would distinguish between the first gate oxide 154 and the second gate oxide 152.

FIG. 8A is a magnified view of the circled section in FIG. 7A and illustrates the second wire 122 and the second gate oxide 152. FIG. 8B is a magnified view of the circled section in FIG. 7B and illustrates the first wire 124 and the first gate oxide 154. As shown, the first gate oxide 154 is thicker than the second gate oxide 152. More specifically, the first gate oxide 154 has a greater thickness when measured from an outer surface of the first wire 124 relative to the thickness of the second gate oxide 152 measured from the outer surface of the second wire 122.

Experimentally for low temperature oxidation (temperature less than about 1000° C.) it was observed that the oxidation rate depends on the wire diameter. The oxidation rate decreases with wire size. Therefore, the first gate oxide 154 is thicker than the second gate oxide 152. The physical origin of this phenomenon is assumed to be a stress build up at the $SiO_2$/Si interface during oxidation.

In item 214, the embodiments herein form gate conductors 160 (FIG. 7A-7B) within the void 110 and around the gate oxides 152, 154. Note that the gate conductors 160 fill the void 110 and therefore completely surround the wires 122, 124 and gate oxides 152, 154. This structure is also referred to as a gate-all-around MOSFET.

The conductors mentioned herein (such as the gate conductors 160) can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, molybdenum, tantalum, aluminum, TiN, TaN, or a metal silicide (e.g. NiSi, PtSi), and may be deposited using physical vapor deposition, chemical vapor deposition, or any other technique known in the art.

In addition, in item 216, the embodiments herein form sidewall spacers 162 (FIGS. 7A-7B) on the gate conductors 160. Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

In item 218, the embodiments herein form source 172 and drain 174 regions by doping (for example, implanting impurities) the portions of the wires 122, 124 that are not covered by the sidewall spacers 162 and/or the gate conductors 160 (FIGS. 9A-9B). The middle portions of the wires 122, 124 comprise the channel regions of the transistors. The impurities used herein can comprises any n-type impurity (n-type impurity, e.g., phosphorus (P), arsenic (As), antimony (Sb) etc.) or any p-type impurity (p-type impurity, e.g., boron, indium, etc.). Due to the small dimension of the wire the channel region is usually left undoped. Further, self-aligned silicide regions 170 can also be formed over the source and drain regions and over the gate (if made of poly-Silicon) by providing a silicide forming metal on the silicon and heating the structure. Examples of silicides that are typically used include NiSi, and PtSi.

In item 220 the various contacts and insulators are formed to complete the transistor. As would be understood by those ordinarily skilled in the art, different processes could be utilized to form different types of transistors and fewer or additional steps could be included in the above process, depending upon the specific goals for the transistor design.

The process described above forms what is known in the art as a nanowire field effect transistor (FET). There are many different techniques that can be utilized to create nanowire FETs, some of which are described in U.S. Patent Publication Numbers 2009/0061568 and 2009/0057762, the complete disclosures of which are incorporated herein by reference.

The process described above forms two different transistors, one of which is shown in FIG. 9A and the other in FIG. 9B. Each includes the substrate 100, the void 110 within the buried oxide 102, at least two wires 122, 124 of semiconductor material 104, a gate oxide 150 around the wires 122, 124, gate conductors 160 within the void 110 and around the wires 122, 124, and sidewall spacers 162 on the gate conductors 160.

As mentioned above, the first wire 124 has a greater width and height than the second wire 122 and the first gate oxide 154 is thicker than the second gate oxide 152. The first gate oxide 154 and the second gate oxide 152 comprise a single oxide layer 150 formed in a single process. The portions of the wires 122, 124 that are not covered by the sidewall spacers 162 and the gate conductors 160 comprise source 172 and drain 174 regions within the wires 122, 124, and the middle portions of the wires 122, 124 comprise channel regions. The middle portions of the wires 122, 124 are completely surrounded by the gate oxide 150 and the gate conductors 160.

Thus, as shown in FIG. 9B, the first wire 124 and corresponding ones of the gate conductors 160, the source and drain regions 172, 174, and the channel region comprise a first transistor having first characteristics. As shown in FIG. 9A, the second wire 122 and corresponding ones of the gate conductors 160, the source and drain regions 172, 174, and the channel region comprise a second transistor that can be immediately adjacent to the first transistor within a single substrate 100 or can at least be located on the same substrate 100. The second transistor can have second characteristics that are different than the first characteristics. Such first characteristics and second characteristics can include one or more of threshold voltage, power capacity, operating voltage, and transistor polarity, etc.

As mentioned above, the first wire 124 has a greater width and height than the second wire 122. The first gate oxide 154 is thicker than the second gate oxide 152. The first gate oxide 154 and the second gate oxide 152 comprise a single oxide layer formed in a single process. The portions of the wires 122, 124 that are not covered by the sidewall spacers 162 and the gate conductors 160 comprise source 172 and drain 174 regions within the wires 122, 124, and the middle portion of the wires 122, 124 comprises a channel region.

The embodiments herein provide transistors with multiple oxide thicknesses using a single oxidation process. The device with the thinner oxide is typically used as high-performance device, while the device with the thicker oxide is typically used to interface with off chip devices.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    simultaneously patterning at least two wires of semiconductor material in a manner that forms a first wire for a first transistor and a second wire for a second transistor and wherein a first wire of the wires has a larger perimeter than a second wire of the wires;
    performing an oxidation process simultaneously on said first wire and said second wire to simultaneously form a first gate oxide around said first wire and a second gate oxide around said second wire, said first gate oxide being thicker than said second gate oxide;
simultaneously forming gate conductors over said first gate oxide and said second gate oxide;
simultaneously forming sidewall spacers on said gate conductors; and
simultaneously doping portions of said first wire and said second wire not covered by said sidewall spacers and said gate conductors to form source and drain regions within said first wire and said second wire and to form said first transistor and said second transistor.

2. The method according to claim, 1 said patterning further comprising:
etching said first wire and said second wire;
suspending said wires;
protecting said first wire with a protective material;
performing at least one cycle of wire thinning on said second wire of said wires, said first wire having a greater width and height than said second wire after said wire thinning; and
removing said protective material from said first wire.

3. The method according to claim 1, said patterning further comprising:
etching said first wire and said second wire, said first wire being wider than second wire;
suspending said wires; and
annealing said wires in hydrogen to redistribute said semiconductor material of said wires such that cross-sections of said wires have a rounded shape, and said first wire having a greater perimeter than said second wire after said annealing.

4. The method according to claim 1, said performing of said oxidation process forming said first gate oxide to have a greater thickness when measured from an outer surface of said first wire relative to a thickness of said second gate oxide measured from an outer surface of said second wire.

5. The method according to claim 1, said doping forming separate source and drain regions within said first wire and second wire.

6. The method according to claim 1, said performing of said oxidation process being performed without the use of masking layers.

* * * * *